United States Patent
Narikawa (10) Patent No.: US 7,733,113 B2
(45) Date of Patent: Jun. 8, 2010

(54) SEMICONDUCTOR TEST DEVICE (75) Inventor: Kenichi Narikawa, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 12/261,489

(22) Filed: Oct. 30, 2008

(65) Prior Publication Data

US 2009/0121738 A1     May 14, 2009

(30) Foreign Application Priority Data

Nov. 14, 2007   (JP)   ............... 2007-295698

(51) Int. Cl.
G01R 31/26     (2006.01)
(52) U.S. Cl. ..................... 324/765; 324/73.1
(58) Field of Classification Search ......... 324/754–765, 324/158.1, 73.1
See application file for complete search history.

(56) References Cited

U.S. PATENT DOCUMENTS

| | | | | |
|---|---|---|---|---|
| 4,497,056 A | * | 1/1985 | Sugamori | ................... 714/736 |
| 4,931,723 A | * | 6/1990 | Jeffrey et al. | ................ 714/730 |
| 4,994,732 A | * | 2/1991 | Jeffrey et al. | ............... 324/73.1 |
| 5,225,775 A | * | 7/1993 | Sekino | ..................... 324/158.1 |
| 5,311,486 A | * | 5/1994 | Alton et al. | .................... 368/10 |
| 6,198,699 B1 | * | 3/2001 | Yamabe | ...................... 368/113 |

FOREIGN PATENT DOCUMENTS

JP        3594135 B2     9/2004

* cited by examiner

Primary Examiner—Ha Tran T Nguyen
Assistant Examiner—Arleen M Vazquez
(74) Attorney, Agent, or Firm—Sughrue Mion, PLLC (57) ABSTRACT A semiconductor test device of the present invention for conducting a test on a device under test, includes: a plurality of comparison units which compare a signal obtained from the device under test with a predetermined reference voltage and output a comparison result; a plurality of measuring units which are provided in correspondence with the plurality of comparison units, and measure a time from when a measurement start signal is input thereto to when the comparison result from a corresponding comparison unit is input thereto, and output a measuring result; a start signal output unit which outputs the measurement start signal at a same timing to each of the plurality of measuring units; and a computation unit which computes time differences between a plurality of signals obtained from the device under test based on the measuring results of the plurality of measuring units.

5 Claims, 5 Drawing Sheets

SEMICONDUCTOR TEST DEVICE

BACKGROUND OF THE INVENTION

1. Field of the Invention

The present invention relates to a semiconductor test device which conducts tests on an IC (Integrated Circuit), an LSI (Large Scale Integration), and the like.

Priority is claimed on Japanese Patent Application No. 2007-295698, filed Nov. 14, 2007, the content of which is incorporated herein by reference.

2. Description of Related Art

Figure 4:
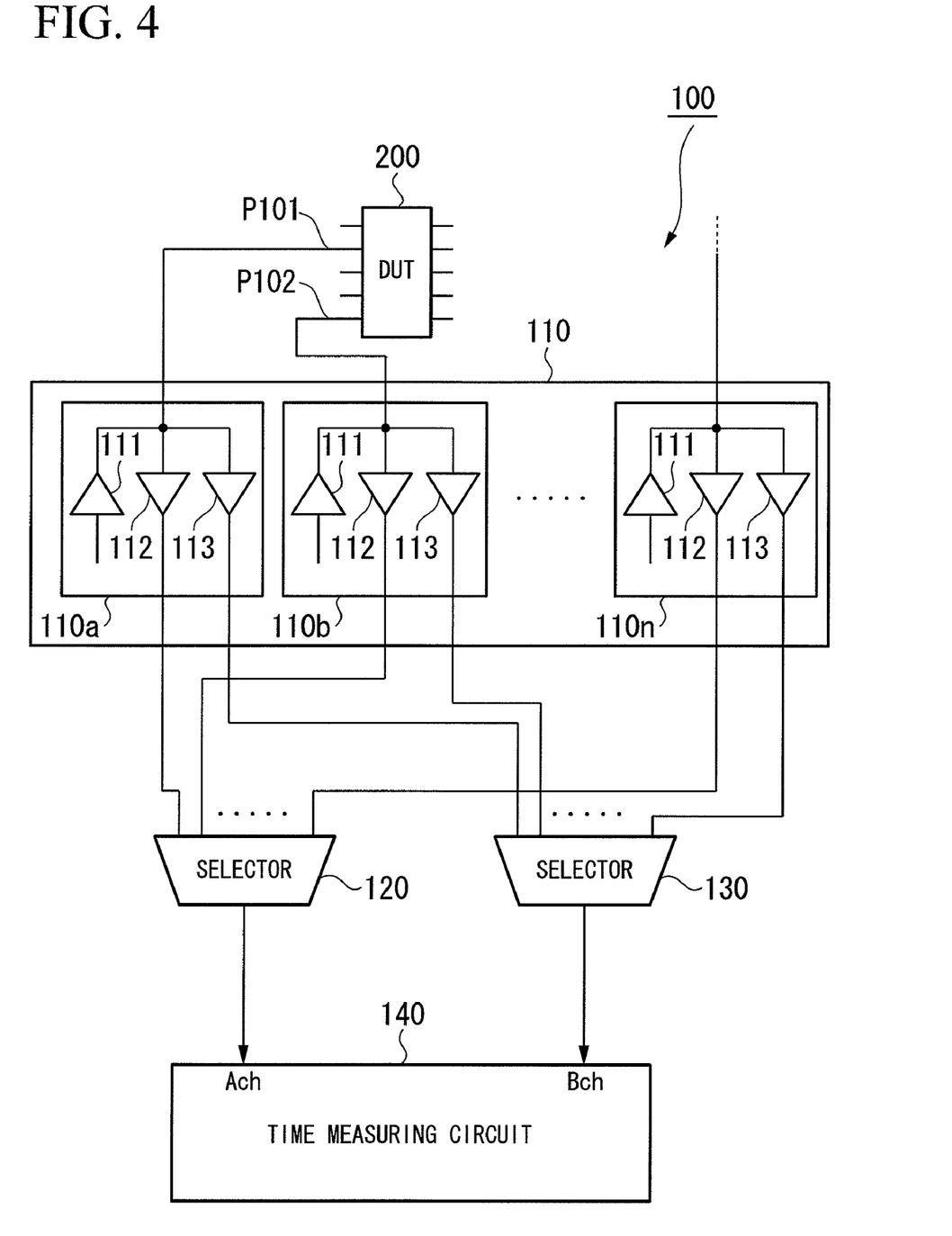
FIG. 4 is a block diagram showing a configuration of principal portions of a conventional semiconductor test device.

FIG. 4 is a block diagram showing a configuration of principal portions of a conventional semiconductor test device. As shown in FIG. 4, the conventional semiconductor test device 100 includes a pin electronics unit 110, selectors 120 and 130, and a time measuring circuit 140. The semiconductor test device 100 conducts various kinds of tests on a device under test (hereinafter, referred to as a "DUT") 200 by using signals obtained by applying test signals on the DUT.

The pin electronics unit 110 includes a plurality of pin electronics circuits 110a to 110n which have a driver 111, a high-side comparator 112, and a low-side comparator 113. Each of the pin electronics circuits 110a to 110n is used for one of pins of the DUT 200. The driver 111 generates a test signal which is applied to the DUT 200. The high-side comparator 112 is a circuit that compares a signal output from the DUT 200 with a predetermined reference voltage ($V_H$) and outputs a signal which indicates the comparison result. The low-side comparator 113 is a circuit that compares a signal output from the DUT 200 with a predetermined reference voltage ($V_L$) which is lower than the reference voltage ($V_H$), and outputs a signal which indicates the comparison result.

The selector 120 is a circuit that selects one of the signals output from each of the high-side comparators 112 provided in the pin electronics circuits 110a to 110n, and outputs it. The selector 130 is a circuit that selects one of the signals output from each of the low-side comparators 113 provided in the pin electronics circuits 110a to 110n, and outputs it. The time measuring circuit 140 has an input channel (Ach) to which a signal selected by the selector 120 is input, and an input channel (Bch) to which a signal selected by the selector 130 is input. The time measuring circuit 140 measures a cycle and a frequency of a signal input to either one of these input channels, or measures a time difference between the signals input to both of these input channels. Signals to be selected by selectors 120 and 130, and measurement to be performed in the time measuring circuit 140 are set under control of a control device (not shown in the figures).

An operation is described in the case of measuring a time difference between signals output from two arbitrary pins (pins P101 and P102 in the example shown in FIG. 4) of the DUT 200, using the semiconductor test device 100 configured as above. Either two of the pin electronics circuits 110a to 110n (for example, the pin electronics circuits 110a and 110b) provided in the pin electronics unit 110 are connected to the pins P101 and P102 of the DUT 200, respectively. Under control of the control device (not shown in the figures), the selectors 120 and 130 are set so that signals output from the pin electronics circuits 110a and 110b are selected. Furthermore, under control of the device, the time measuring circuit 140 is set so that the time is measured from when a signal is input to the input channel (Ach) to when a signal is input to the input channel (Bch).

After completion of the above settings, application of test signals to the DUT 200 starts, and signals corresponding to the test signals are output from the pins P101 and P102 of the DUT 200. These signals are input to the pin electronics circuits 110a and 110b, respectively, and compared with the reference voltages ($V_H$, $V_L$). The signals which indicate the comparison results are then output to each of the selectors 120 and 130 from the pin electronics circuits 110a and 110b. The selector 120 selects the signal from the high-side comparator 112 in the pin electronics circuit 110a. The selector 130 selects the signal from the low-side comparator 113 in the pin electronics circuit 110b. The time measuring circuit 140 measures the time from when the signal selected by selector 120 is input to the input channel (Ach) of the time measuring circuit 140 to when the signal selected by selector 130 is input to the input channel (Bch) of the time measuring circuit 140. As a result, the time difference between the signals output from the pins P101 and P102 of the DUT 200 is measured.

Figure 5:
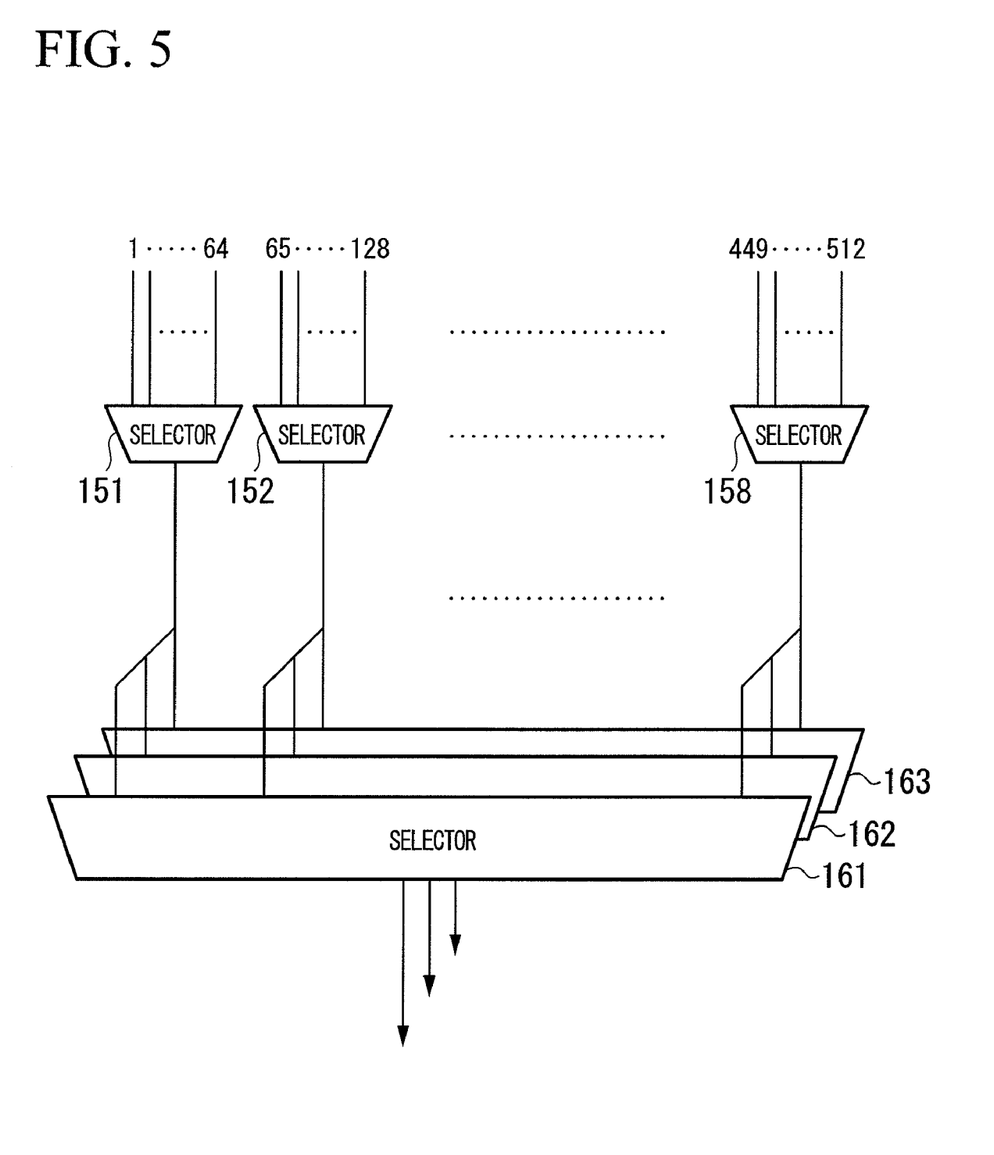
FIG. 5 shows a configuration of portions of a conventional semiconductor test device which can perform plurality of tests on DUT simultaneously while suppressing increase in the scale of circuits and the number of wirings.

FIG. 4 shows a configuration which is necessary to test a single DUT 200 in order to simplify the description. If a plurality of DUT are tested simultaneously, a semiconductor test device is required to be configured to include a plurality of selectors 120 and 130, and a plurality of time measuring circuits 140 which are shown in FIG. 4. The number of DUT 200 which can be tested by the semiconductor test device 100 simultaneously depends on the number of the time measuring circuits 140 provided in the semiconductor test device 100. Here, it is assumed that the semiconductor test device 100 is merely configured to include a plurality of selectors 120 and 130. In this configuration, if the number of tests carried out to the DUT 200 simultaneously is large, the scale of circuits and the number of wirings are dramatically increased. FIG. 5 shows a configuration of portions of a conventional semiconductor test device which can perform a plurality of tests on DUT simultaneously while suppressing an increase in the scale of circuits and the number of wirings. In FIG. 5, the total number of the pin electronics circuits 110a to 110n provided in the pin electronics unit 110 is 512.

The semiconductor test device shown in FIG. 5 includes eight selectors 151 to 158 which are positioned at a front stage and three selectors 161 to 163 which are positioned at a rear stage. FIG. 5 shows a configuration in which three time measuring circuits 140 are provided in the semiconductor test device. Each of the selectors 151 to 158 is provided for each of 64 of 512 pin electronics circuits. Each of the selectors 151 to 158 selects one of 64 signals and outputs it. The selectors 161 to 163 receive each of the eight signals selected by the selectors 151 to 158, select one of the received eight signals and output it. The signals selected by the selectors 161 to 163 are output to the three time measuring circuits 140, respectively. By configuring the semiconductor test device as above, it is possible to test three DUT 200 simultaneously while suppressing an increase in the scale of the circuits and the number of wirings.

For detail of the conventional semiconductor test device which can measure, for example, a time interval between two signals output from a DUT, refer to, for example Japanese Patent Publication No. 3594135.

The time measuring circuit 140 provided in the conventional semiconductor test device has only two input channels. Thus, for example, when a DUT which outputs three or more signals such as three-phase PWM (Pulse Width Modulation) signals are tested, it is impossible to measure time differences between a plurality of signals simultaneously. Conventionally, when such a DUT is subjected to tests, the time difference between two selected signals among a plurality of signals is measured multiple times while changing combinations of selected signals. Therefore, there is a problem that a long time is required for tests.

Moreover, in the conventional semiconductor test device, if the number of DUT to be tested simultaneously is increased greatly, it is required to increase the number of the selectors 151 to 158 at the front stage. However, if the number of the selectors 151 to 158 at the front stage is increased, the number of wirings is largely increased and the circuit scale of the selectors 161 to 163 at the rear stage is increased. Thus, it is not easy to increase the number of DUT to be tested simultaneously.

Furthermore, in the conventional semiconductor test device shown in FIG. 5, the allocation of pins of the DUT 200 cannot be performed freely because of constraints due to the selectors 151 to 158 at the front stage. For example, the selector 151 is used for selecting and outputting one of the signals output from first to sixty-fourth pin electronics circuits. Thus, it is impossible to allocate two of the 64-pin electronics circuits connected to the selector 151 to two pins of the DUT 200 so as to measure a time difference between signals output from these pins. Because of such constraints, there is a problem that wiring of connecting wirings which connect pin electronics circuits with DUT is complicated.

SUMMARY OF THE INVENTION

The present invention has been devised in light of the above circumstances. An object of this invention is to provide a semiconductor test device which can greatly shorten test time required for tests by enabling measurement of three or more signals simultaneously and by greatly increasing the number of DUT which can be tested simultaneously, and can largely improve flexibility in the allocation of DUT pins.

In order to attain this object, a semiconductor test device of the present invention for conducting a test on a device under test, includes: a plurality of comparison units which compare a signal obtained from the device under test with a predetermined reference voltage and output a comparison result; a plurality of measuring units which are provided in correspondence with the plurality of comparison units, and measure a time from when a measurement start signal is input thereto to when the comparison result from a corresponding comparison unit is input thereto, and output a measuring result; a start signal output unit which outputs the measurement start signal at a same timing to each of the plurality of measuring units; and a computation unit which computes time differences between a plurality of signals obtained from the device under test based on the measuring results of the plurality of measuring units.

According to this configuration, when the measurement start signal is output from the start signal output unit, time measurement starts simultaneously in each of the measuring units. When the comparison result obtained by comparing the signal from the device under test with the predetermined reference voltage is input to the corresponding measuring unit from the comparison unit, the time measurement in the time measuring unit is terminated. Based on the measuring results of each of the measuring units, the time differences between the plurality of signals obtained from the device under test are then computed in the computation unit.

The semiconductor test device of the present invention may further include: a bus including at least one signal line; a switch unit which switches a connection between the comparison unit and a signal line of the at least one signal line to an open state or a closed state; a first selecting unit which selects a signal line of the at least one signal line; and a gate unit which is provided between the comparison unit and the measuring unit, and controls an open/closed state in accordance with a signal which is transmitted via the signal line selected by the first selecting unit.

In the semiconductor test device of the present invention, the comparison unit may compare the signal obtained from the device under test with each of a predetermined first voltage and a predetermined second voltage, and output a first comparing result and a second comparing result, the first voltage and the second voltage having different values, and the measuring unit may measure at least one of a first time from when the measurement start signal is input thereto to when the first comparison result from the corresponding comparison unit is input thereto, and a second time from when the measurement start signal is input thereto to when the second comparison result from the corresponding comparison unit is input thereto.

The semiconductor test device of the present invention may further include a second selecting unit which is provided between the comparison unit and the switch unit and selects either one of the first comparison result and the second comparison result output from the comparison unit.

In the semiconductor test device of the present invention, the switch unit, the first selecting unit, the second selecting unit, and the gate unit may be combined into a first combination of the switch unit and the second selecting unit, and a second combination of the first selecting unit and the gate unit, and each of the first combination and the second combination may be provided in correspondence with at least one of the comparison units.

In the semiconductor test device of the present invention, the computation unit may store a skew correction value indicating a characteristic non-uniformity of the comparison unit in advance and compute the time differences between the plurality of signals obtained from the device under test after the measuring result in the measuring unit is corrected based on the skew correction value.

According to the present invention, upon output of the measuring start signal, each of the measuring units starts time measurement simultaneously. Upon input of the comparison result obtained by comparing the signal from the device under test with the predetermined reference voltage to the corresponding measuring unit from the comparing unit, the time measurement in the time measuring unit is terminated. Based on the measuring results of each of the measuring units, the time differences between the plurality of signals obtained from the device under test are computed in the computation unit. Therefore, it is possible to measure three or more signals output from a device under test simultaneously, and thereby, test time can be greatly shortened.

Moreover, according to the present invention, the measuring units are provided in correspondence with the comparing units. Therefore, it is possible to conduct tests on a plurality of devices under test simultaneously, and thereby test time can be greatly shortened.

Furthermore, according to the present invention, the measuring units are provided in correspondence with the comparing units. Thus, flexibility in the allocation of pins of the device under test is greatly improved. As a result, it is possible to simply connect the pin electronics circuits with the device under test using connecting wirings.

DETAILED DESCRIPTION OF THE INVENTION

Hereinafter, semiconductor test devices according to embodiments of the present invention are described in detail with reference to the drawings.

First Embodiment

Figure 1:
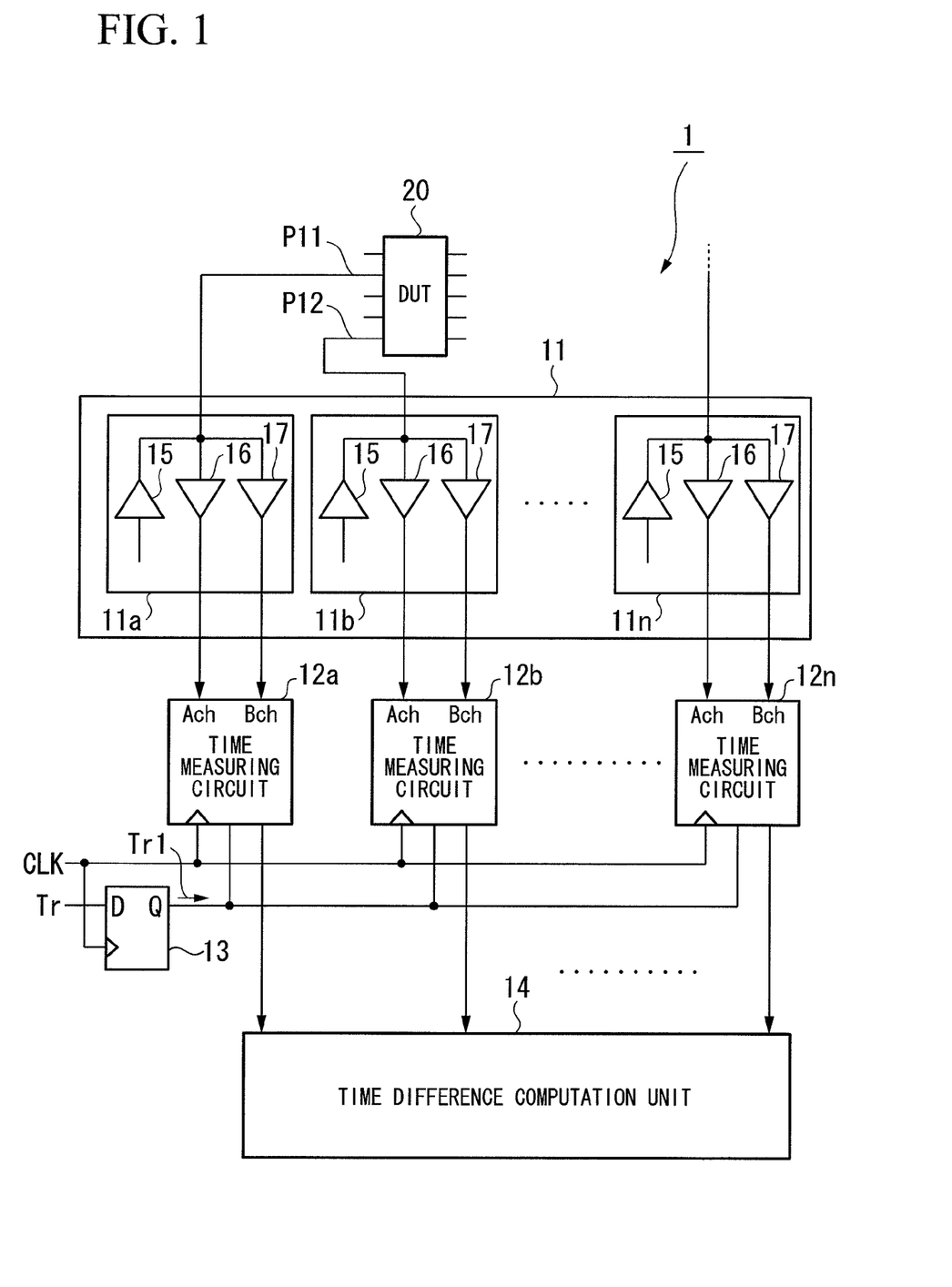
FIG. 1 is a block diagram showing a configuration of principal portions of a semiconductor test device according to a first embodiment of the present invention.

FIG. 1 is a block diagram showing a configuration of principal portions of a semiconductor test device according to a first embodiment of the present invention. As shown in FIG. 1, the semiconductor test device 1 of the embodiment includes a pin electronics unit 11, time measuring circuits (measuring units) 12a to 12n, a flip-flop (start signal output unit) 13, a time difference computation unit (computation unit) 14. The semiconductor test device 1 conducts various kinds of tests on a device under test (DUT) 20 by using signals obtained by applying test signals on the DUT 20.

The pin electronics unit 11 includes a plurality of pin electronics circuits 11a to 11n which have a driver 15, a high-side comparator (comparing unit) 16, and a low-side comparator (comparing unit) 17. Each of the pin electronics circuits 11a to 11n is used for one pin of pins of the DUT 20. The driver 15 generates a test signal which is applied to the DUT 20. The high-side comparator 16 is a circuit that compares a signal output from the DUT 20 with a predetermined reference voltage ($V_H$) and outputs a signal which indicates the comparison result. The low-side comparator 17 is a circuit that compares a signal output from the DUT 20 with a predetermined reference voltage ($V_L$) which is lower than the reference voltage ($V_H$), and outputs a signal which indicates the comparison result.

The time measuring circuits 12a to 12n are provided in correspondence with the pin electronics circuits 11a to 11n, respectively. Each of the time measuring circuits 12a to 12n measures the time from when a trigger signal (measurement start signal) Tr1 output from the flip-flop 13 to when a signal (a signal indicating the comparison result) output from the corresponding pin electronics circuit among the pin electronics circuits 11a to 11n are input, in synchronization with a clock signal CLK. The time measuring circuits 12a to 12n are provided in a timing generator (not shown in the figures) provided in the semiconductor test device 1. The timing generator is a device which generates, for example, signals for regulating a timing for applying a test signal to the DUT 20 and a timing for determining pass or fail.

To be more specific, the time measuring circuits 12a to 12n have an input channel (Ach) to which a signal indicating a comparison result in the high-side comparator 16 is input, and an input channel (Bch) to which a signal indicating a comparison result in the low-side comparator 17 is input. The time measuring circuits 12a to 12n detect at least either one of the time from when the trigger signal Tr1 is input to when a signal is input to the input signal (Ach) and the time from when the trigger signal Tr1 is input to when a signal is input to the input signal (Bch), in synchronization with the clock signal CLK. The time measuring circuits 12a to 12n also measure a cycle and a frequency of a signal input to either one of the input channels (Ach, Bch) or measure a time difference between signals input to both of the input channels in addition to above-mentioned measurement.

The flip-flop 13 receives a trigger signal Tr at a D input terminal and the clock signal CLK at a clock input terminal. The flip-flop 13 synchronizes the trigger signal Tr to the clock signal CLK and outputs it as the trigger signal Tr1. The trigger signal Tr is output from a control device (not shown in the figures). The time difference computation unit 14 receives each of measurement results from the time measuring circuits 12a to 12n and selects two arbitrary input measurement results to compute the time difference between these results. By employing this configuration, it is possible to measure a time difference between signals output from two arbitrary pins of the DUT 20. Measurement to be performed in the time measuring circuit 12a to 12n and measurement results to be selected in the time difference computation unit 14 are set under control of the control device (not shown in the figures).

Figure 2:
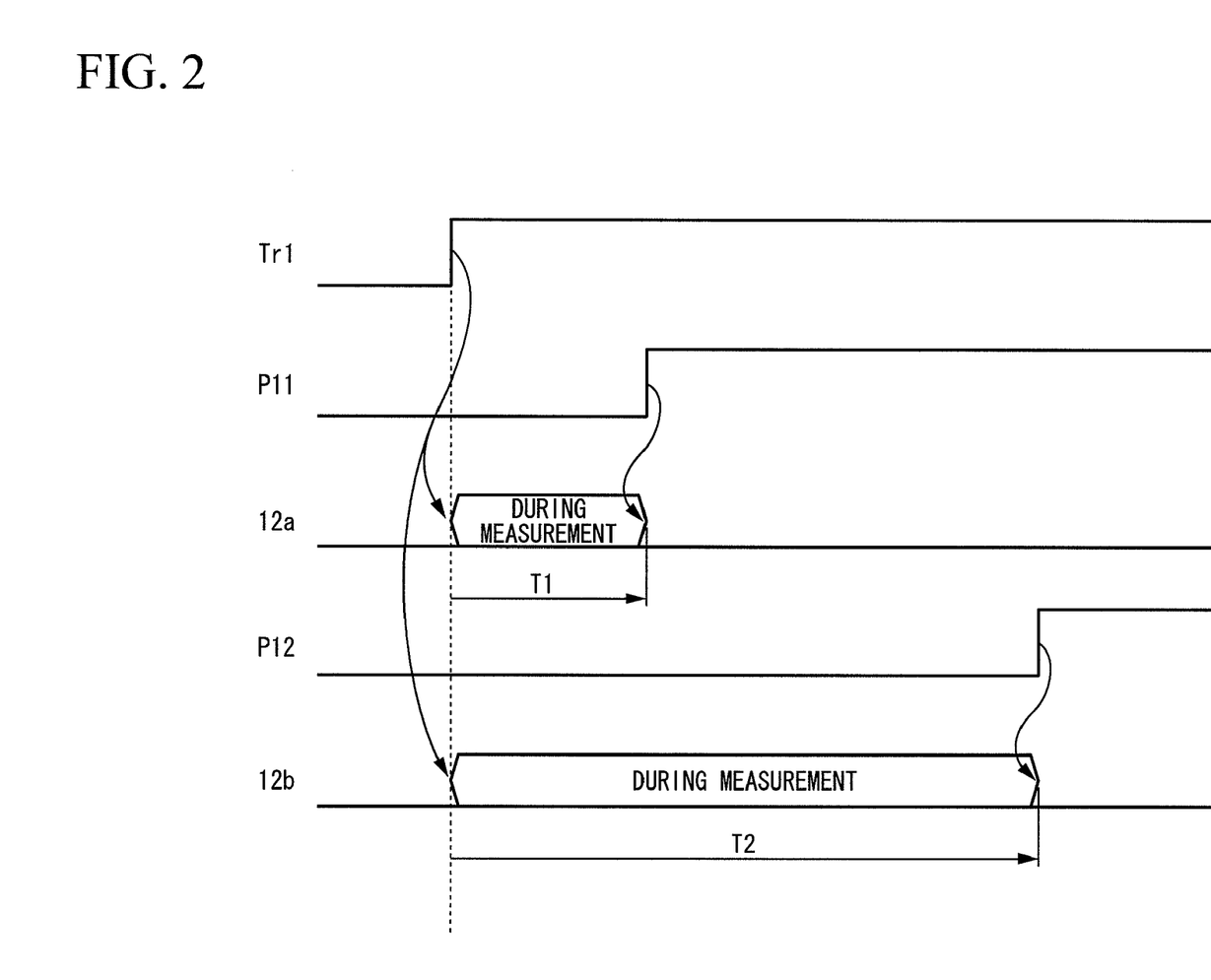
FIG. 2 is a timing chart for illustrating an operation of the semiconductor test device according to the first embodiment of the present invention.

An operation is described in the case of measuring a time difference between signals output from two arbitrary pins (pins P11 and P12 in the example shown in FIG. 1) of the DUT 20, using the semiconductor test device 1 configured as above. FIG. 2 is a timing chart for illustrating an operation of the semiconductor test device according to the first embodiment of the present invention. Firstly, either two of the pin electronics circuits 11a to 11n (for example, the pin electronics circuits 11a and 11b) provided in the pin electronics unit 11 are connected to the pins P11 and P12 of the DUT 20, respectively.

Under control of the control device (not shown in the figures), the time measuring circuits 12a and 12b are then set so that the time is measured from when the trigger signal Tr1 is input to when a signal is input to, for example, the input channel (Ach). Furthermore, under control of the control device, the time difference computation unit 14 is set so that measurement results from the time measuring circuits 12a and 12b are selected and a time difference between them is computed.

In order to simplify the description, as an example, the case is described in which the time from when the trigger signal Tr1 is input to when a signal is input to the input channel (Ach) is measured in each of the measuring circuits 12a and 12b. As another setting, the time measuring circuits 12a and 12b may be set so that the time is measured from when the trigger signal Tr1 is input to when a signal is input to the input channel (Bch).

After completion of the above settings, the trigger signal Tr is output to the flip-flop 13 from the control device (not shown in the figures), an application of test signals to the DUT 20 starts, and thereby tests on the DUT 20 starts. When the trigger signal Tr is input to the flip-flop 13, the trigger signal Tr1 in synchronization with the clock signal CLK is generated. The trigger signal Tr1 is input to each of the time measuring circuits 12a to 12n. Here, only operations of the time measuring circuits 12a and 12b are described, and descriptions of operations of the time measuring circuits 12c to 12n are omitted.

When the trigger signal Tr1 which is generated at the flip-flop 13 is input to the time measuring circuits 12a and 12b, time measurement starts in synchronization with the clock signal CLK in the time measuring circuits 12a and 12b. In the example shown in FIG. 2, at a rising edge of the trigger signal Tr1, time measurement in the time measuring circuits 12a and 12b is started simultaneously. On the other hand, when test signals are applied to the DUT 20, the pins P11 and P12 of the DUT 20 output signals corresponding to the test signals.

As shown in FIG. 2, suppose that there is a difference in timings between signals of the pins P11 and P12 of the DUT 20. This difference in timings is designated as a time difference ΔT. In the example shown in FIG. 2, firstly, a signal output from the pin P11 of the DUT 20 is input to the pin electronics circuit 11a and compared with the reference voltages ($V_H$, $V_L$). The signals indicating the comparison results are then input to the time measuring circuit 12a from the pin electronics circuit 11a. When the signal (in this example, the signal indicating the comparison result obtained by comparing the signal output from the pin P11 with the reference voltage ($V_H$)) is input to the time measuring circuit 12a, the time measurement in the time measuring circuit 12b is stopped. The time measured in the above process is designated as a time T1.

After the above-mentioned time difference ΔT has elapsed since the signal was output from the pin P11 of the DUT 20, a signal is output from the pin P12 of the DUT 20 and is input to the pin electronics circuit 11b and compared with the reference voltages ($V_H$, $V_L$). The signals indicating the comparison results are then input to the time measuring circuit 12b from the pin electronics circuit 11b. When the signal (in this example, the signal indicating the comparison result obtained by comparing the signal output from the pin P12 with the reference voltage ($V_H$)) is input to the time measuring circuit 12b, the time measurement in the time measuring circuit 12b is stopped. The time measured in the above process is designated as a time T2.

The comparison results by the time measuring circuits 12a and 12b are input to the time difference computation circuit 14, respectively. The time difference computation circuit 14 performs computation of subtracting the time T1 measured in the time measuring circuit 12a from the time T2 measured in the time measuring circuit 12b (that is, computes the time T2−the time T1). As a result, the time difference ΔT between the signals output from the pins P11 and P12 of the DUT 20 can be obtained.

In the above description, in order to simplify the description, as the example, the case is described in which the time difference between the signals output from the two pins P11 and P12 of the DUT 20. Moreover, the semiconductor test device 1 of the embodiment can measure time differences between signals output from three or more pins of the DUT 20 at once, in a similar procedure described above.

To be more specific, for example, the three pin electronics circuits 11a to 11c are connected to three different pins, respectively. The time measuring circuits 12a to 12c provided in correspondence with the pin electronics circuits 11a to 11c are set so that a time is measured from when the trigger signal Tr1 is input to when a signal is input to, for example, the input channel (Ach). In addition, the time difference computation unit 14 is set so as to select three signals output from each of the pin electronics circuits 11a to 11c and compute time differences between these signals. After completion of the above settings, when tests are started in the procedure described above, it is possible to obtain the time differences between the signals output from the three pins of the DUT 20 at once.

Moreover, in the semiconductor test device according to the embodiment, the time measuring circuits 12a to 12n are provided in correspondence with the pin electronics circuits 12a to 12n, respectively. Therefore, it is possible to conduct tests on a plurality of DUT 20 at the same time, and thereby test time can be greatly shortened.

Furthermore, since the time measuring circuits 12a to 12n are provided in correspondence with the pin electronics circuits 11a to 11n, there is no constraint due to selectors occurred in the conventional semiconductor test device 100. Thus, flexibility in the allocation of pins of the DUT is greatly improved. As a result, it is possible to simply connect the pin electronics circuits with the DUT using connecting wirings.

Second Embodiment

Figure 3:
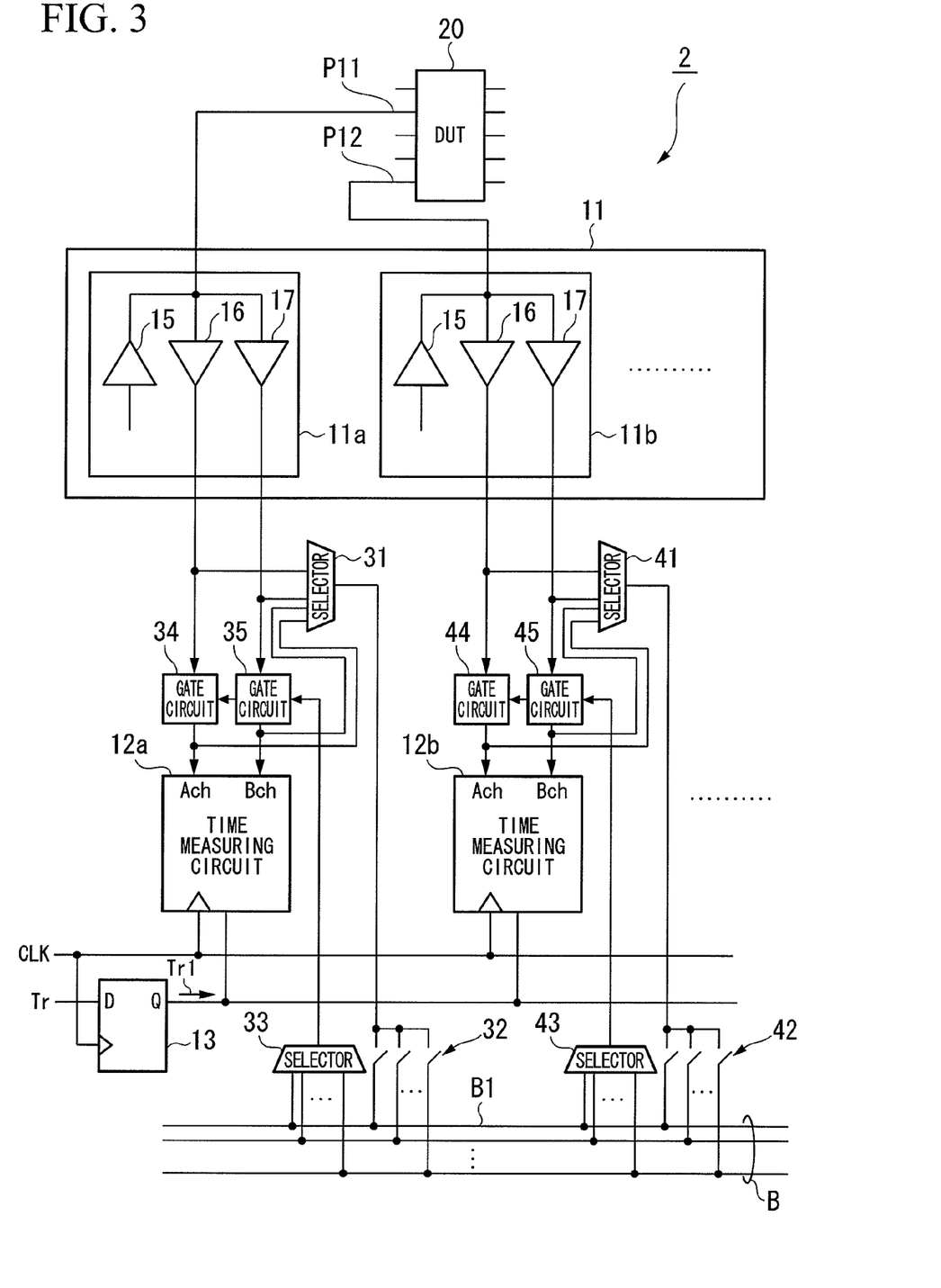
FIG. 3 is a block diagram showing a configuration of principal portions of a semiconductor test device according to a second embodiment of the present invention.

FIG. 3 is a block diagram showing a configuration of principal units of a semiconductor test device according to a second embodiment of the present invention. In FIG. 3, blocks similar to those shown in FIG. 1 are denoted by the same reference symbols. The time difference computation unit 14 shown in FIG. 1 is omitted in FIG. 3. As shown in FIG. 3, the semiconductor test device 2 of the embodiment includes an arming bus (bus) B, as well as the circuits and the like which are provided in the semiconductor test device 1 shown in FIG. 1. The semiconductor test device 2 also includes a selector (second selecting unit) 31, a switch unit 32, a selector (first selecting unit) 33 and gate circuits (gate units) 34 and 35 which correspond to the pin electronics circuit 11a, and a selector (second selecting unit) 41, a switch unit 42, a selector (first selecting unit) 43, and gate circuits (gate units) 44 and 45 correspond to the pin electronics circuit 11b. The selector 31, the switch unit 32, the selector 33, the gate circuits 34 and 35 are collectively referred to as a first circuit group. The selector 41, the switch unit 42, the selector 43, the gate circuits 44 and 45 are collectively referred to as a second circuit group. Other pin electronics circuits (not shown in the figures) also include circuits and the like similar to the first circuit group.

The first circuit group and the second circuit group and the like are provided to achieve an arming function of prohibiting input of signals to the time measuring circuits 12a to 12n until when an external trigger (in this case, a signal from the DUT 20) is input and a positive time measuring function of measuring a positive time of a time difference between signals output from the pins of the DUT 20. The positive time measuring function is a function in which a time difference ΔT of a positive number is always obtained regardless orders of timings of a plurality of signals output from the DUT 20.

That is, in the above mentioned first embodiment, the time difference computation circuit 14 computes the time T2−the time T1 and obtains the time difference ΔT. Thus, if the timing of a signal output from the pin P12 of the DUT 20 lags the timing of a signal output from the pin P11 of the DUT 20, the time difference ΔT becomes a positive number. However, in the reverse case, the time difference ΔT becomes a negative number. In the second embodiment, by providing the first circuit group and the second circuit group and the like in the semiconductor test device, the positive time measuring function is achieved in which the time difference ΔT is always made to be a positive number.

The arming bus B is composed of at least one signal line and is a bus which is employed to transmit a variety of types of signals. Both the first circuit group provided in correspondence with the pin electronics circuit 11a and the second circuit group provided in correspondence with the pin electronics circuit 11b have a similar configuration. Therefore, the first circuit group provided in correspondence with the pin electronics circuit 11a is described in the following. Description of the second circuit group provided in correspondence with the pin electronics circuit 11b and configurations provided in correspondence with other pin electronics circuits is omitted.

The selector 31 selects either one of signals output from the high-side comparator 16 and the low-side comparator 17 provided in the pin electronics circuit 11a and signals output from the gate circuits 34 and 35. In the configuration shown in FIG. 3, signal outputs from the gate circuits 34 and 35 are directly input to the selector 31. However, a latch circuit may be provided between the gate circuits 34 and 35, and the selector 31, which holds output signals from the gate signals 34 and 35.

The switch unit 32 is a switch which connects an output terminal of the selector 31 with either one of the signal lines constituting the arming bus B. The switch unit 32 switches a connection between the high-side comparator 16 or the low-side comparator 17 provided in the pin electronics circuit 11a, and one of the signal lines constituting the arming bus B in an open state or in a closed state. The selector 33 selects either one of the signal lines constituting the arming bus B. A signal to be selected by the selector 31, a signal line to be connected to the output terminal of the selector 31 at the switch unit 32, and a signal line to be selected by the selector 33 are set under control of the control device (not shown in the figures).

The gate circuit 34 is provided between the high-side comparator 16 of the pin electronics circuit 11a and the input channel (Ach) of the time measuring circuit 12a. The gate circuit 34 controls an open/close state in accordance with a signal transmitted via the signal line selected by the selector 33. The gate circuit 35 is provided between the low-side comparator 17 of the pin electronics circuit 11a and the input channel (Bch) of the time measuring circuit 12a. The gate circuit 35 controls an open/close state in accordance with a signal transmitted via the signal line selected by the selector 33. Initial states of the gate circuits 34 and 35, and an operation mode are also set under control of the control device (not shown in the figures).

Operations are described in the case where the arming function and the positive time measuring function are used, in sequence, employing the semiconductor test device 2 configured as above. When the arming function is used, for example, the following three settings are performed, under control of the control device (not shown in the figures). The setting for selecting a signal from the low-side comparator 17 of the pin electronics circuit 11a is performed. The setting for connecting the output terminal of the selector 31 with a signal line B1 that is one of the signal lines constituting the arming bus B is performed. The setting for selecting the signal line B1 at the selector 43. In initial states, connections between the high-side comparator 16 and the low-side comparator 17 of the pin electronics circuit 11b, and the time measuring circuit 12b are respectively set to be the closed states by the gate circuits 44 and 45.

After completion of the above settings, when a signal to be an arming trigger is output from the pin P11 of the DUT 20, the signal is input to the pin electronics circuit 11a and is compared with the reference voltage ($V_L$) in the low-side comparator 17, and then the signal indicating the comparison result is output. The signal output from the low-side comparator 17 is selected by the selector 31 and is input to the gate circuits 44 and 45 via the switch unit 32, the signal line B1 of the arming bus B and the selector 43 in this order. As a result, the gate circuits 44 and 45 become the open states, and thus, signals output from the high-side comparator 16 and the low-side comparator 17 of the pin electronics circuit 11b are input to the time measuring circuit 12b. Conversely, the gate circuits 44 and 45 are in the closed states as long as a signal from the pin P11 of the DUT 20 is not input to them, and thus, signals output from the high-side comparator 16 and the low-side comparator 17 of the pin electronics circuit 11b are not input to the time measuring circuit 12b.

Suppose that a signal indicating a comparison result is output from the high-side comparator 16 of the pin electronics circuit 11b is output after a predetermined time has passed since a signal indicating a comparison result was output from the low-side comparator 17 of the pin electronics circuit 11a. In this case it is possible to use the signal as follows. That is, the gate circuits 44 and 45 are made to be the open states by using the signal output from the low-side comparator 17 of the pin electronics circuit 11a as an external trigger, and the signal output from the high-side comparator 16 of the pin electronics circuit 11b is input to the time measuring circuit 12b.

When the positive time measuring function is used, initial states of the gate circuits 34 and 35 provided in correspondence with the pin electronics circuit 11a is set to be the open states regardless of whether a signal is input from the selector 33 or not, under control of the control device (not shown in the figures). However, if an arming trigger is applied by using a signal from another pin, initial states of the gate circuits 34 and 35 are set to be the closed states. The setting for selecting either one of signals output from the gate circuits 34 and 35 (in this case, an output signal from the gate circuit 34) by the selector 31 is performed. The setting for connecting the output terminal of the selector 31 with the signal line B1 which is one of the signal lines constituting the arming bus B, is also performed.

Moreover, the setting for selecting the signal line B1 by the selector 43 provided in correspondence with the pin electronics circuit 11b, under control of the control device (not shown in the figures). In initial states, connections between the high-side comparator 16 and the low-side comparator 17 of the pin electronics circuit 11b and the time measuring circuit 12 are respectively set to be the closed states by the gate circuits 44 and 45.

After completion of the above settings, when the trigger signal Tr is output from the control device (not shown in the figures) and the trigger signal Tr1 is output from the flip-flop 13 in synchronization with the clock signal CLK, time measurement starts in the measuring circuits 12a and 12b, and the like. If a signal is output from the pin P12 of the DUT 20 prior to a signal being output from the P11 of the DUT 20, the signal is ignored since both gate circuits 44 and 45 provided between the pin electronics circuit 11b and the time measuring circuit 12b are in the closed states.

On the other hand, when a signal is output from the pin P11 of the DUT 20, the signal is input to the pin electronics circuit 11a, and compared with the reference voltage ($V_H$) in the high-side comparator 16, and the signal indicating the comparison result is output. Since the gate circuit 34 provided between the pin electronics circuit 11a and the time measuring circuit 12a is in the open state, the signal output from the high side comparator 16 of the pin electronics circuit 11a passes through the gate circuit 34 and is input to the time measuring circuit 12a, and thereby the time measurement in the time measuring circuit 12a is terminated. The time measured in the above process is designated as a time T3.

In addition, an output signal of the gate circuit 34 to which the signal output from the high-side comparator 16 of the pin electronics circuit 11a has been input, is selected by the selector 31 and passes through the switch unit 32, the signal line B1 of the arming bus B and the selector 43 in this order, and is then input to the gate circuits 44 and 45 provided in correspondence with the pin electronics circuit 11b. As a result, the gate circuits 44 and 45 become the open states.

Thereafter, when a signal is output from the pin P12 of the DUT 20, the signal is input to the pin electronics circuit 11b, and compared with the reference voltage ($V_H$) in the high-side comparator 16, and the signal indicating the comparison result is output. Since the gate circuit 44 provided between the pin electronics circuit 11b and the time measuring circuit 12b is in the open state, the signal output from the high side comparator 16 of the pin electronics circuit 11b passes through the gate circuit 44 and is input to the time measuring circuit 12b, and thereby the time measurement in the time measuring circuit 12b is terminated. The time measured in the above process is designated as a time T4.

In this manner, a signal input to the pin electronics circuit 11b is performed always after a signal input to the pin electronics circuit 11a is performed. Thus, the time T4 which is measured in the time measuring circuit 12b is longer than the time T3 which is measured in the time measuring circuit 12a. Therefore, when the time difference computation circuit 14 (not shown in FIG. 3) performs computation of subtracting the time T3 measured in the time measuring circuit 12a from the time T4 measured in the time measuring circuit 12b (that is, computes the time T4−the time T3), the time difference ΔT between the signals output from the pins P11 and P12 of the DUT 20 becomes a positive. In this way, it is possible to measure the time difference ΔT as a positive number.

Since the above described semiconductor test device 2 according to the second embodiment also includes the time measuring circuits 12a to 12n which are provided in correspondence with the pin electronics circuits 11a to 11n respectively, a plurality of DUT can be tested at the same time, and time differences between signals output from three or more pins of the DUT 20 can be obtained at once. Therefore, test time can be greatly shortened. Furthermore, since the time measuring circuits 12a to 12n are provided in correspondence with the pin electronics circuits 11a to 11n, there is no constraint due to selectors occurred in the conventional semiconductor test device 100. Thus, flexibility in the allocation of pins of the DUT is greatly improved. As a result, it is possible to simply connect the pin electronics circuits with the DUT using connecting wirings.

While the semiconductor test devices according to the embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, in the above described semiconductor test devices 1 and 2 according to the first and second embodiments, times from when the trigger signal Tr1 is input to when signals from the pin electronics circuits 11a to 11n are input to the time measuring circuits 12a to 12n can be measured. Thus, it is possible to adjust skews (comparator skews) caused by characteristic non-uniformity of the high-side comparators 16 and the low-side comparators 17.

That is, first, the drivers 15 which are provided in each of the pin electronics circuits 11a to 11n are made to output predetermined signals at the same timing respectively. Then, times from when time measurement is started by inputting the trigger signal Tr1 to each of the time measuring circuits 12a to 12n to when the signals from each of the drivers 15 are input to the time measuring circuits 12a to 12n, are measured respectively. Here, though skews (driver skews) between the drivers 15 also occur, it is supposed that the driver skews are adjusted with high precision. Next, one of the measurement results obtained in the time measuring circuits 12a to 12n is set as a reference value, and time differences between the reference value and the other measurement results are obtained in advance as skew correction values. These are then stored in the time difference computation unit 14.

When performing tests on the DUT 20, the time difference computation unit 14 adds the skew correction values to the measurement results obtained from the time measuring circuits 12a to 12n, and the time differences ΔT between signals output from pins of the DUT 20 are then obtained. In this manner, comparator skews of high-side comparators 16 and the low-side comparators 17 can be adjusted. Here, as the example, the case is described in which measurement results of the time difference measuring circuits 12a to 12n are corrected by the skew correction values. However, instead of this, delay lines or verniers (not shown in the figures) provided for adjusting comparator skews may be adjusted based on the above skew correction values.

Moreover, in the above-described second embodiment, the case is described in which the first circuit group is provided in correspondence with the pin electronics circuit 11a, the second circuit group is provided in correspondence with the pin electronics circuit 11b, and the other pin electronics circuits (not shown in the figures) also include circuits similar to the first circuit group. However, it is not always necessary to provide circuits similar to the first circuit group in correspondence with each of pin electronics circuits.

For example, in the semiconductor test device shown in FIG. 3, it is possible to omit the selector 33, and the gate circuits 34 and 35 which are provided in correspondence with the pin electronics circuit 11a, and the selector 41 and the switch unit 42 which are provided in correspondence with the pin electronics circuit 11b. In this way, the semiconductor test device 2 can be configured so that a combination of the selector 31 and the switch unit 32 (or the selector 41 and the switch unit 42), and a combination of the selector 33 and gate circuits 34 and 35 (or the selector 43 and gate circuits 44 and 45) are provided in correspondence with at least one of the pin electronics circuits 11a to 11n. By employing this configuration, the circuit scale can be reduced.

Furthermore, the semiconductor test device may be configured so that the selector 31 (or selector 41) is provided in correspondence with a plurality of pin electronics circuits. In this configuration, signals output from a plurality of pin electronics circuits are selected by this selector. In addition, the semiconductor test device may be configured so that one selector 33 (or selector 43) is provided in correspondence with a plurality of pin electronics circuits. In this configuration, an open/close state of a gate circuit provided in correspondence with a plurality of pin electronics circuits is controlled by a signal transmitted via the arming bus B selected by the selector 33. By employing this configuration, since the number of the selectors 31 (or selectors 41) and the switch units 32 (or switch units 42), or the number of the selectors 33 (or selectors 34) can be decreased, and thereby the circuit scale can be reduced.

What is claimed is:

1. A semiconductor test device for conducting a test on a device under test, comprising: a plurality of comparison units which compare a signal obtained from the device under test with a predetermined reference voltage and output a comparison result; a plurality of measuring units which are provided in correspondence with the plurality of comparison units and measure a time from when a measurement start signal is input thereto to when the comparison result from a corresponding comparison unit is input thereto, and output a measuring result; a start signal output unit which outputs the measurement start signal at a same timing to each of the plurality of measuring units; and a computation unit which computes time differences between a plurality of signals obtained from the device under test based on the measuring results of the plurality of measuring units; a bus including at least one signal line; a switch unit which switches a connection between one of said plurality of comparison units and a signal line of the at least one signal line to an open state or a closed state; a first selecting unit which selects a signal line of the at least one signal line; and a gate unit which is provided between one of said plurality of comparison units and one of said plurality of measuring units, and controls an open/closed state in accordance with a signal which is transmitted via the signal line selected by the first selecting unit.

2. The semiconductor test device according to claim 1, wherein one of said plurality of comparison units compares the signal obtained from the device under test with each of a predetermined first voltage and a predetermined second voltage, and outputs a first comparing result and a second comparing result, the first voltage and the second voltage having different values, and one of said plurality of measuring units measures at least one of a first time from when the measurement start signal is input thereto to when the first comparison result from the corresponding comparison unit is input thereto, and a second time from when the measurement start signal is input thereto to when the second comparison result from the corresponding comparison unit is input thereto.

3. The semiconductor test device according to claim 2, further comprising a second selecting unit which is provided between one of said plurality of comparison units and the switch unit and selects either one of the first comparison result and the second comparison result output from one of said plurality of comparison units.

4. The semiconductor test device according to claim 3, wherein the switch unit, the first selecting unit, the second selecting unit, and the gate unit are combined into a first combination of the switch unit and the second selecting unit, and a second combination of the first selecting unit and the gate unit, and each of the first combination and the second combination is provided in correspondence with at least one of said plurality of comparison units.

5. The semiconductor test device according to claim 1, wherein the computation unit stores a skew correction value indicating a characteristic non-uniformity of one of said plurality of comparison units in advance and computes the time differences between the plurality of signals obtained from the device under test after the measuring result in one of said plurality of measuring units is corrected based on the skew correction value.

* * * * *